United States Patent
Elend

(10) Patent No.: US 7,482,815 B2
(45) Date of Patent: Jan. 27, 2009

(54) METHOD OF OPERATING A SHIELDED CONNECTION, AND COMMUNICATION NETWORK

(75) Inventor: Bernd Elend, Hamburg (DE)

(73) Assignee: NXP B.V., Eindhoven (NL)

( * ) Notice: Subject to any disclaimer, the term of this patent is extended or adjusted under 35 U.S.C. 154(b) by 132 days.

(21) Appl. No.: 11/579,888

(22) PCT Filed: May 9, 2005

(86) PCT No.: PCT/IB2005/051496

§ 371 (c)(1),
(2), (4) Date: Nov. 10, 2006

(87) PCT Pub. No.: WO2005/111636

PCT Pub. Date: Nov. 24, 2005

(65) Prior Publication Data

US 2008/0030201 A1    Feb. 7, 2008

(30) Foreign Application Priority Data

May 13, 2004    (EP) .................................. 04102083

(51) Int. Cl.
*G01R 31/08* (2006.01)

(52) U.S. Cl. .................. 324/523; 324/539; 324/543; 307/64; 307/113; 375/257

(58) Field of Classification Search .............. 324/523, 324/627, 628; 379/17; 375/257
See application file for complete search history.

(56) References Cited

U.S. PATENT DOCUMENTS

| 4,077,022 | A | * | 2/1978 | Pitts, Jr. .......................... 333/1 |
| 4,357,545 | A | * | 11/1982 | Le Grand et al. .............. 307/64 |
| 4,814,713 | A | * | 3/1989 | Van Brunt et al. ........... 324/539 |
| 5,491,368 | A | * | 2/1996 | Yamamoto ................... 307/113 |
| 6,181,140 | B1 | * | 1/2001 | Vokey et al. ................. 324/523 |
| 6,873,160 | B1 | * | 3/2005 | Eslambolchi et al. ....... 324/523 |
| 7,072,407 | B2 | * | 7/2006 | Schurig ....................... 375/257 |
| 2002/0041187 | A1 | * | 4/2002 | Oertel et al. ................. 324/543 |

FOREIGN PATENT DOCUMENTS

WO    WO 2052745 A1 * 7/2002

* cited by examiner

*Primary Examiner*—Timothy J Dole
*Assistant Examiner*—Benjamin M Baldridge

(57) ABSTRACT

To provide a method of operating a shielded connection where signals are exchanged between two nodes (1) on a communications network over a connecting line (5a, 5b) and the connecting line (5a, 5b) has a shield (3), by which method can be established that the shield (3) is in a proper state, it is proposed that when a signal is transmitted from a first node (1) over the connecting line (5) to a neighboring node a current ($I_{shield}$) is drawn into the shield (3) and when operation is taking place in other ways the shield (3) is set to a bias voltage ($U_{Bias}$). A suitably arranged communications network is also specified.

7 Claims, 1 Drawing Sheet

METHOD OF OPERATING A SHIELDED CONNECTION, AND COMMUNICATION NETWORK

Figure 1:
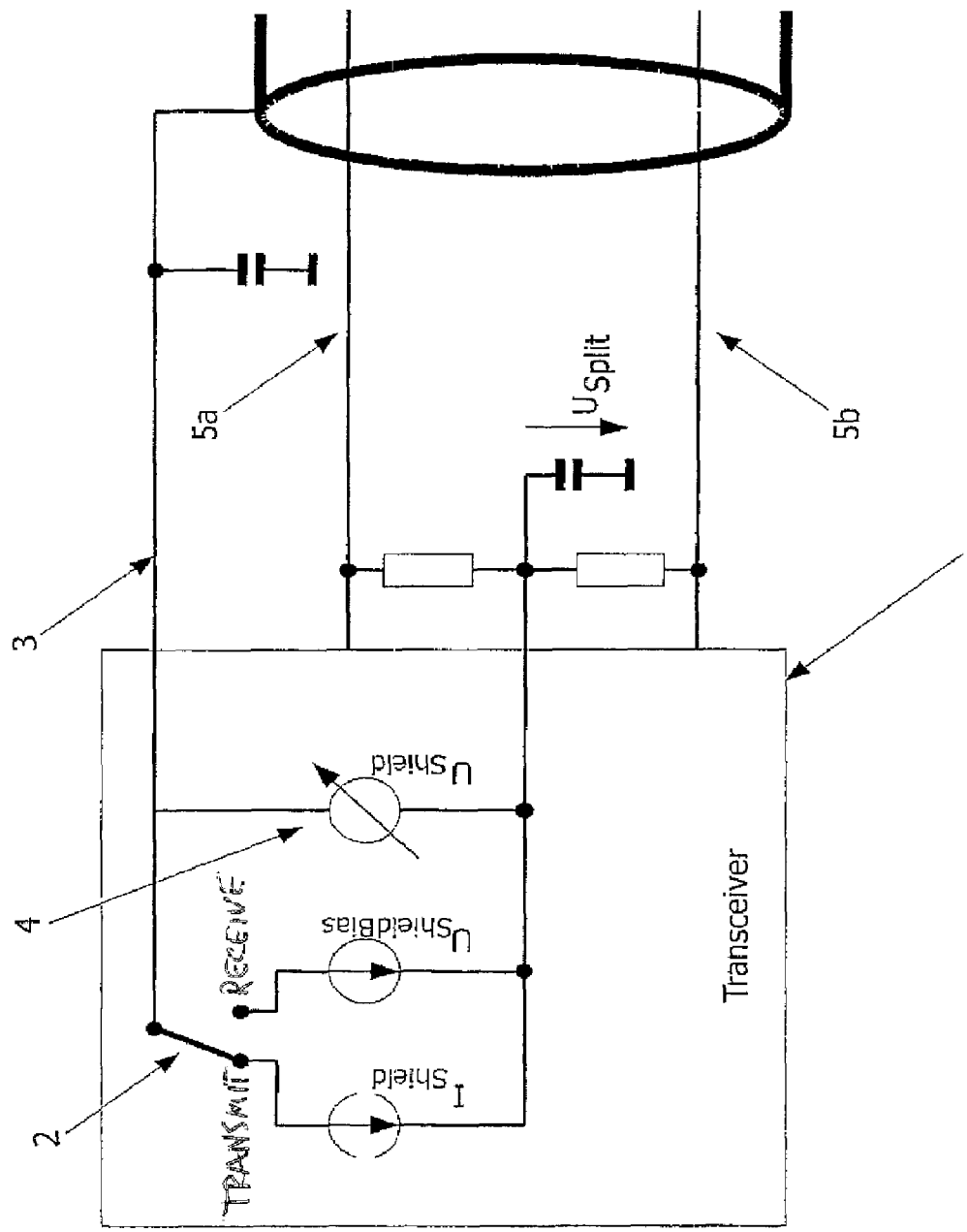

The invention relates to a method of operating a shielded connection on a communications network where signals are exchanged between two nodes on the communications network over a connecting line and the connecting line has a shield, and to a communications network.

On communications networks, varied signals are exchanged between the nodes forming the communications network, the signals either being passed on from one node to the next and/or being processed at the node. For the exchange of signals, use is made of message transmission protocols familiar to those skilled in the art by which transmission and reception at the nodes are coordinated. What are used for the connection between, i.e. the exchange of signals between, the individual nodes are connecting lines in the form of, amongst others, metal wires, by which the signals are usually transmitted in the form of electrical impulses. To ensure that signals are transmitted without interference when for example external electromagnetic fields are present, the connecting lines each have shield, which in certain applications may be ungrounded. The shield may be produced in the form of a braid of copper wire forming a sheath round the connecting line. For the connecting line to be fully shielded, it is necessary for the shield to be continuous over the entire length of the connecting line and to be connected to corresponding shields at the node, to stop interfering electromagnetic fields that might have an adverse effect on the signal transmission from entering.

Something that can be considered a disadvantage in this case is that damage to the shield can only be found by making a separate check on the shield, which means that while the operation of transmitting messages from one node to another is underway, any degradation of the shielding action caused by a fault in the shield cannot be detected.

It is an object of the invention to specify a method of operating a shielded connection by which the proper state of the shield can be monitored while operation is underway. A corresponding communications network is also to be provided.

These objects are achieved by virtue of the features specified in claims 1 to 6.

The invention lies in the fact that the shield of a connecting line, which shield is connected to a shield at the node, may alternatively have a current applied to it or may be set to a voltage, by a changeover means provided at the node. In this case, when the node is in the transmitting mode, i.e. when the node in question is transmitting a message over the connecting line to, for example, a neighboring node, a current is applied to the shield and a current is drawn from the shield in the respective cases. If the shield is intact, this current, in particular a d.c. current, flows through the shield to the next node and can there be measured with a suitable current measuring device. What this means is that there are transmitted from the one node both a message over the connecting line and a constant current over the shield. If the receiving node on the communications network receives both a message over the connecting line and the current over the shield, then this neighboring node is able to establish that the shield is undamaged. If there were a complete break in the shield then, although a signal would be received, no current whatever would arrive at the receiving node and in this way it would be established that there was a break in the shield. If for example the shield were short-circuited to ground due to a fault in the insulation, the current would flow away to ground and would not reach the adjacent node and it would likewise be established that the message transmission was faulty. If there were only a partial break in the shield, this would resolute in a reduced current level, which could likewise be interpreted to mean faulty message transmission.

Despite what is said-above, the real core concept of the invention however is for the shield of the connecting line to be set to a voltage and for this voltage to be measured. When the node is operating in other ways, i.e. when it is receiving a message or is neither transmitting nor receiving a message, the shield is set to a bias voltage by the changeover means, which bias voltage can be determined with a suitable measuring device either in the neighboring node or preferably in the node itself, and in this case too differences from the preset bias voltage can be established in the node itself or in the adjoining node and damage to the shield can be registered in this way.

It goes without saying that, in the state where it is connected to the node, the shield of the connecting line is connected, by suitable connecting means, to the changeover means and to the shield of the node itself.

The advantage of the invention lies in the fact that damage to the shield of a connecting line between two nodes can easily be determined by this method and by a communications network of this kind.

Advantageous embodiments of the invention are characterized in the respective sets of dependent claims.

As claimed in claims 2 and 7, what is preferably selected is a bias voltage on the shield relative to the voltage $U_{Split}$ or a current flow from the shield to the center of the voltage divider that generates $U_{Split}$. The advantage of this is that the bias voltage $U_{Bias}$ is not selected relative to ground at a voltage of zero, so that the analysis of the measurements is not affected, even while the communications network is operating, by shifts in the zero point such as typically occur in networks in motor vehicles.

To allow the proper state of the shield to be checked, the voltage $U_{Shield}$, as characterized in claims 3 and 8, is monitored on the shield preferably at all the nodes between which a message is transmitted over the connecting line. The different states of the shield can be established in this case from the voltage $U_{Shield}$ applied to the shield as shown in the following table.

|  | Transmit | Receive |
| --- | --- | --- |
| Shield grounded | $U_{Shield} < U_{Limit, low}$ | $U_{Shield} < U_{Limit, low}$ |
| Break in shield | $U_{Shield} < U_{Limit, low}$ | $U_{Limit, low} < U_{Shield} < U_{Limit, high}$ |
| Shield short-circuited to supply voltage | $U_{Shield} < U_{Limit, high}$ | $U_{Shield} < U_{Limit, high}$ |
| Shield OK | $U_{Limit, low} < U_{Shield} < U_{Limit, high}$ | $U_{Limit, low} < U_{Shield} < U_{Limit, high}$ |

The following condition applies in this case:

$$U_{Limit, low} < U_{Shield} < U_{Limit, high}$$

When the shield is grounded, the voltage $U_{Shield}$ on the shield collapses and the voltage $U_{Shield}$ on the shield is less than a first value $U_{Limit, low}$ that forms a lower limit for the voltage. During transmission, this is also true when there is a break in the shield, because here is then no voltage applied to the shield at the transmitting node. If the shield is short-circuited to a supply voltage of the system the voltage $U_{Shield}$ on the shield exceeds a value $U_{Limit, high}$ that forms an upper limit for the voltage. In the receiving mode, the voltage at the receiving node is between these two limits if the shield is unbroken.

In message transmission that takes place under a non-arbitration-free protocol, e.g. a CAN protocol, or when time-controlled protocols, e.g., FlexRay for message transmission, are beginning, collisions may occur on the communication network. What this means is that messages, or parts thereof, are transmitted over a connecting line by two nodes simultaneously, and each are then not correctly received at the other node. To stop the shield monitoring from being incorrectly interpreted, the monitoring of the shield, i.e., the analysis of the voltage, is not begun until after a time delay of a reasonable sampling time from the changeover. In principle, the changeover may also take place at some other point in time preset by the protocol.

These and other aspects of the invention are apparent from and will be elucidated with reference to the embodiments described hereinafter.

IN THE DRAWINGS

FIG. 1 shows a network node having a shielded connecting line.

A node 1 on a communications network can be seen in the view shown in FIG. 1. At the node 1, electrical signals for message transmission are transmitted and received over the connecting lines 5a and 5b, which are for example a twisted-pair cable, and if required are processed or passed on to other neighboring nodes. The connecting line 5 is protected against external electromagnetic factors by a shield 3, to prevent the signals transmitted from being falsified.

In addition, the node 1 has a changeover means 2 by which a current $I_{Shield}$ is fed into the shield 3 in the transmit mode or, in the other mode (receive), the shield is set to a bias voltage $U_{Bias}$. There is also provided at the node 1 a voltage measuring device 4 to determine the voltage $U_{Shield}$ that is applied between the shield 3 and the intermediate voltage $U_{Split}$ between the connecting lines 5a and 5b. Damage to, or short-circuit of, the shield 3 can be detected by this voltage measuring device 4, because when this is the ease the voltage $U_{Shield}$ measured is no longer with the correct limits $U_{Limit,low}$ and $U_{Limit,high}$. This is established at the mode 1 and a fault is therefore assumed to exist.

| LIST OF REFERENCE NUMERALS: | |
|---|---|
| 1 | Node on a communications network |
| 2 | Changeover means |
| 3 | Shield |
| 4 | Voltage measuring device |
| 5a, 5b | Connecting line |

The invention claimed is:

1. A method of operating a shielded connection where signals are exchanged between two nodes on a communication network over a connecting line and the connecting line has a shield, wherein when a signal is transmitted from a first node over the connecting line to a neighboring node, a current is drawn from the shield and when a signal is being received by a first node from a neighboring node, or the shielded connection is idle, the shield is set to a bias voltage, said bias voltage being within an upper and a lower limit.

2. The method as claimed in claim 1, wherein said bias voltage is set and monitored relative to a reference voltage.

3. The method as claimed in claim 2, wherein the monitoring of the said bias voltage takes place after a time delay from a changeover from transmission between nodes to operation of the said shielded connection in other ways.

4. The method as claimed in claim 3, wherein the changeover from transmission between nodes to operation of the said shielded connection in other ways takes place at a point in time predetermined by a protocol.

5. A communication network having a plurality of nodes that exchange signals over connecting lines, each line having a shield, wherein a changeover means provided at the node introduces a current onto the said shield when transmitting, and sets the said shield to a bias voltage when the line is receiving, or idle, said bias voltage being within an upper and a lower limit.

6. The communication network as claimed in claim 5, wherein the said bias voltage applied to the shield can be set and monitored relative to a reference voltage.

7. The communication network as claimed in claim 6, wherein a time-delay unit is provided for the said bias voltage monitoring.

* * * * *